United States Patent
Hsu et al.

(10) Patent No.: US 8,406,372 B2
(45) Date of Patent: Mar. 26, 2013

(54) BI-DIRECTIONAL SHIFT REGISTER

(75) Inventors: Kuo-Hua Hsu, Hsin-Chu (TW);
Kun-Yueh Lin, Hsin-Chu (TW);
Yu-Chung Yang, Hsin-Chu (TW);
Kuo-Chang Su, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/481,955

(22) Filed: May 28, 2012

(65) Prior Publication Data

US 2012/0235890 A1    Sep. 20, 2012

Related U.S. Application Data

(62) Division of application No. 12/899,541, filed on Oct. 6, 2010, now Pat. No. 8,218,713.

(30) Foreign Application Priority Data

Jul. 8, 2010  (TW) ................................ 99122453 A

(51) Int. Cl.
*G11C 19/00* (2006.01)

(52) U.S. Cl. ................................ 377/64; 377/69; 377/79

(58) Field of Classification Search .......................... None
See application file for complete search history.

(56) References Cited

U.S. PATENT DOCUMENTS

| | | | |
|---|---|---|---|
| 5,859,630 A * | 1/1999 | Huq | 345/100 |
| 6,418,182 B1 | 7/2002 | Suyama | |
| 6,556,646 B1 * | 4/2003 | Yeo et al. | 377/54 |
| 6,970,530 B1 * | 11/2005 | Wang et al. | 377/69 |
| 7,397,885 B2 | 7/2008 | Moon | |
| 7,436,923 B2 | 10/2008 | Tobita | |
| 7,738,622 B2 | 6/2010 | Cho | |
| 7,873,140 B2 | 1/2011 | Moon | |
| 7,953,201 B2 * | 5/2011 | Tsai et al. | 377/64 |
| 8,045,675 B2 | 10/2011 | Chan | |
| 2007/0127620 A1 | 6/2007 | Moon | |
| 2007/0217564 A1 * | 9/2007 | Tobita | 377/64 |
| 2007/0274433 A1 * | 11/2007 | Tobita | 377/64 |
| 2009/0115792 A1 | 5/2009 | Otose | |
| 2009/0206909 A1 | 8/2009 | Chen | |
| 2011/0026665 A1 * | 2/2011 | Chan et al. | 377/69 |
| 2011/0157124 A1 | 6/2011 | Jung | |

FOREIGN PATENT DOCUMENTS

| | | |
|---|---|---|
| CN | 1240043 A | 12/1999 |
| CN | 101261881 A | 9/2008 |
| JP | 2009134845 A | 6/2009 |

* cited by examiner

*Primary Examiner* — Tuan T Lam

(74) *Attorney, Agent, or Firm* — Winston Hsu; Scott Margo

(57) ABSTRACT

A shift register of an LCD device includes a plurality of shift register units coupled in series. Each shift register unit includes an input circuit and a pull-down circuit having symmetric structures which enable the LCD device to function in a forward-scan mode and a reverse-scan mode.

8 Claims, 13 Drawing Sheets

BI-DIRECTIONAL SHIFT REGISTER

CROSS REFERENCE TO RELATED APPLICATIONS

This application is a division of U.S. application Ser. No. 12/899,541, now U.S. Pat. No. 8,218,713, filed on Oct. 6, 2010, the entirety of which is incorporated by reference.

BACKGROUND OF THE INVENTION

1. Field of the Invention

The present invention is related to a shift register, and more particularly, to a bi-directional shift register for use in a liquid crystal display device.

2. Description of the Prior Art

Liquid crystal display (LCD) devices, characterized in low radiation, thin appearance and low power consumption, have gradually replaced traditional cathode ray tube display (CRT) devices and are widely used in electronic products such as notebook computers, personal digital assistants (PDAs), flat-panel TVs, or mobile phones. In a traditional LCD device, images are displayed by scanning the pixels of the panel using external driving chips. However, gate-on-array (GOA) technique has been developed in order to reduce the number of devices and manufacturing costs by fabricating driving circuits directly on the panel.

FIG. 1 is a simplified block diagram of a prior art LCD device 100. Partial structure of the LCD device 100 is illustrated, including a plurality of gate lines GL(1)-GL(N), a shift register 110, a clock generator 120, and a power supply 130. The clock generator 120 is configured to provide a start pulse signal VST and two clock signals CK1, CK2 for operating the shift register 110. The power supply 130 is configured to provide bias voltages VDD and VSS for operating the shift register 110.

The shift register 110 includes a plurality of shift register units SR(1)-SR(N) coupled in series and having output ends respectively coupled to the corresponding gate lines GL(1)-GL(N). According to the clock signals CK1, CK2 and the start pulse signal VST, the shift register 110 sequentially outputs gate driving signals GS(1)-GS(N) to the corresponding gate lines GL(1)-GL(N) using the shift register units SR(1)-SR(N), respectively. In the prior art LCD device 100, each shift register unit includes an input circuit, a pull-up circuit, a first pull-down circuit, and a second pull-down circuit. The shift register 110 is a two-phase shift register in which the odd-numbered stages of the shift register units operate according to the clock signal CK1 and the even-numbered stages of the shift register units operate according to the clock signal CK2. The clock signals CK1 and CK2 periodically switch between an enable level and a disable level, and only one of the clock signals CK1 and CK2 is at enable level at the same time.

FIG. 2 is a diagram illustrating an nth stage shift register unit SR(n) among the plurality of shift register units SR(1)-SR(N) (assuming n is an odd integer between 1 and N). The prior art shift register unit SR(n) includes an output end OUT(n), a node Q(n), a pull-up circuit 15, an input circuit 25, a first pull-down circuit 35, and a second pull-down circuit 40. The shift register unit SR(n) is configured to output a gate driving signal GS(n) to a gate line GL(n).

The pull-up circuit 15 includes a transistor switch T9 having a control end coupled to the node Q(n), a first end coupled to the clock generator 120 for receiving the clock signal CK1, and a second end coupled to the output end OUT(n). The input circuit 25 includes a transistor switch T1 having a control end coupled to the output end of an (n−1)th stage shift register unit SR(n−1), a first end coupled to the power supply 130 for receiving the bias voltage VDD, and a second end coupled to the node Q(n). The first pull-down circuit 35 includes a transistor switch T5 having a control end coupled to the output end of an (n+1)th stage shift register unit SR(n+1), a first end coupled to the node Q(n), and a second end coupled to the power supply 130 for receiving the bias voltage VSS. Therefore, the input circuit 25 can maintain the level of the node Q(n) according to the (n−1)th stage gate driving signal GS(n−1), and the first pull-down circuit 35 can maintain the level of the node Q(n) according to the (n+1)th stage gate driving signal GS(n+1). When the level of the node Q(n) is higher than the turn-on voltage of the transistor switch T9, the clock signal CK1 may be transmitted to the output end OUT(n) via the conducting transistor switch T9 for supplying the gate driving signal GS(n). On the other hand, the second pull-down circuit 40 is configured to stabilize voltages at the output end OUT(n).

If the shift register 100 is configured to scan in a specific direction (such as scanning the gate lines GL(1)-GL(N) sequentially in a forward direction), the LCD device 100 fails to function normally in other driving modes (such as scanning the gate lines GL(N)-GL(1) sequentially in a reverse direction). In other words, the prior LCD device 100 only provides uni-directional scanning.

SUMMARY OF THE INVENTION

The present invention provides a bi-directional shift register including a plurality of shift register units coupled in series. An $(n-1)^{th}$ stage shift register unit among the plurality of shift register units is configured to provide an $(n-1)^{th}$ stage output voltage according to a first clock signal and an $(n-1)^{th}$ stage input voltage. An $n^{th}$ stage shift register unit among the plurality of shift register units is configured to provide an $n^{th}$ stage output voltage according to a second clock signal and an $n^{th}$ stage input voltage. An $(n+1)^{th}$ stage shift register unit among the plurality of shift register units is configured to provide an $(n+1)^{th}$ stage output voltage according to a third clock signal and an $(n+1)^{th}$ stage input voltage. The $n^{th}$ stage shift register unit includes an output end for outputting the $n^{th}$ stage output voltage, an $n^{th}$ node, a pull-up circuit, an input circuit and a pull-down circuit. The pull-up circuit is configured to provide the $n^{th}$ stage output voltage according to the second clock signal and a voltage level of the $n^{th}$ node. The input circuit is configured to receive the $(n-1)^{th}$ stage output voltage and the $(n+1)^{th}$ stage output voltage, supply the $(n-1)^{th}$ stage output voltage as the $n^{th}$ stage input voltage when the bi-directional shift register scans in a first direction, supply the $(n+1)^{th}$ stage output voltage as the $n^{th}$ input voltage when the bi-directional shift register scans in a second direction opposite to the first direction, and conduct the pull-up circuit according to the $(n-1)^{th}$ stage output voltage and the $(n+1)^{th}$ stage output voltage. The pull-down circuit is configured to turn off the pull-up circuit according to a first voltage received from an $x^{th}$ stage shift register unit among the plurality of shift register units when the bi-directional shift register scans in the first direction, and configured to turn off the pull-up circuit according to a second voltage received from a $y^{th}$ stage shift register unit among the plurality of shift register units when the bi-directional shift register scans in the second direction, wherein n is a positive integer larger than 1, x is an integer larger than n, and y is a positive integer smaller than n.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
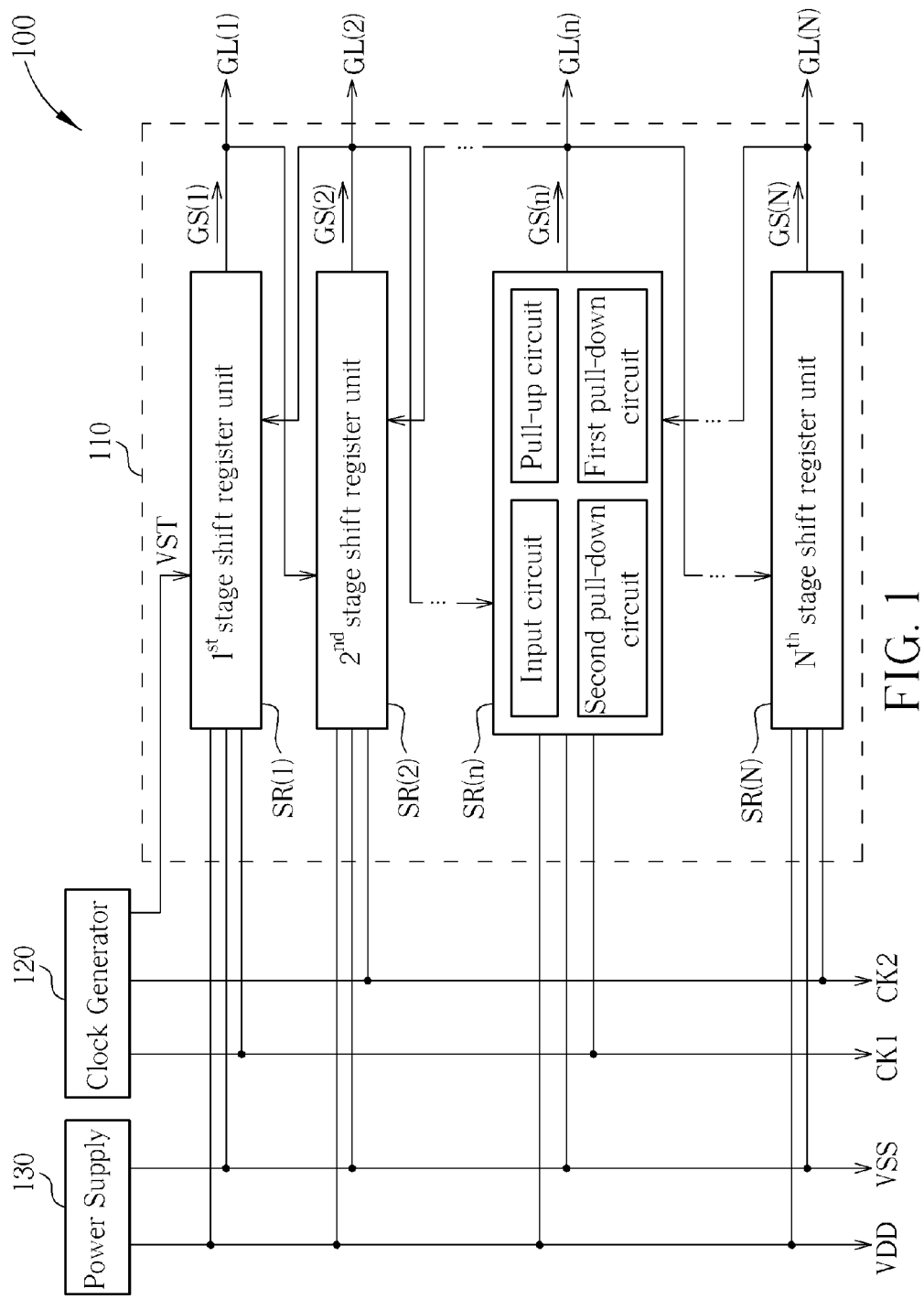
FIG. 1 is a simplified block diagram of a prior art LCD device.
Figure 2:
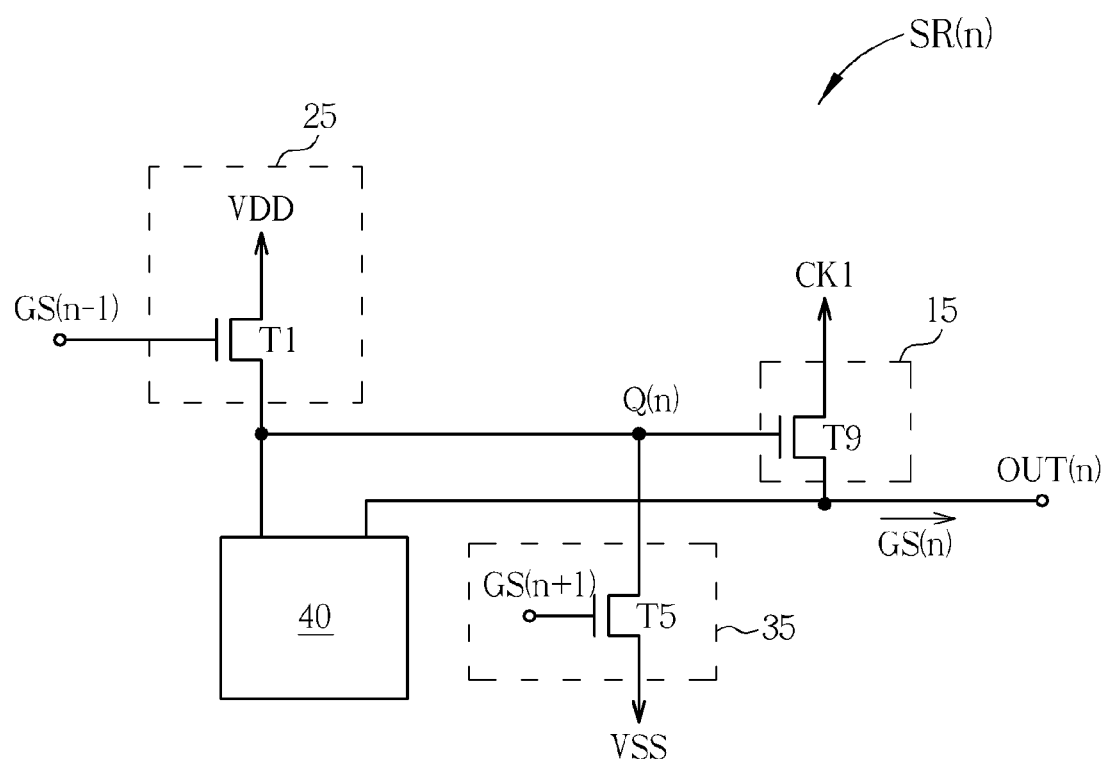
FIG. 2 is a diagram illustrating an $n^{th}$ stage shift register unit in the prior art LCD device.
Figure 3:
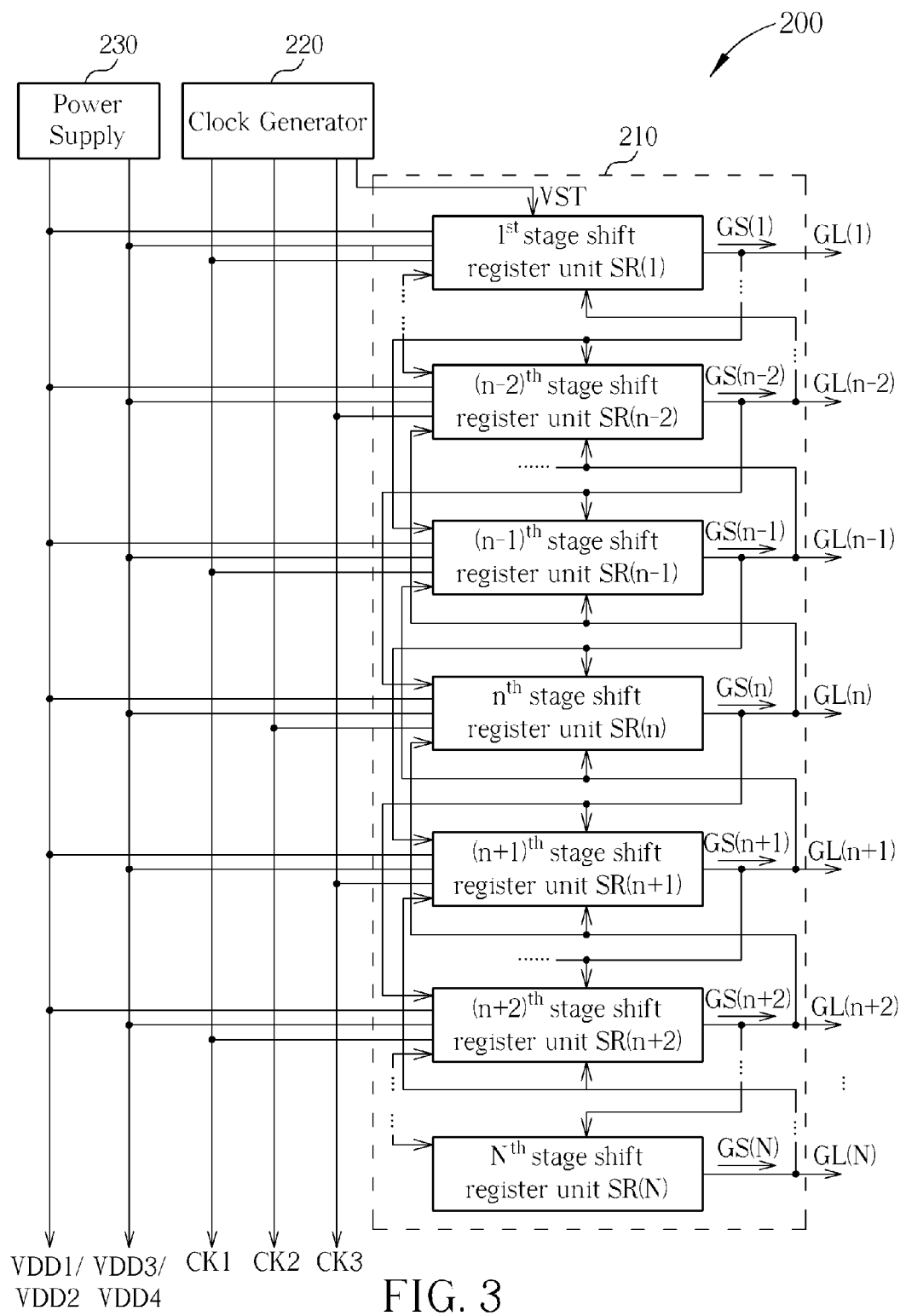
FIG. 3 is a simplified block diagram of an LCD device according to the present invention.

FIG. 3 is a simplified block diagram of an LCD device 200 according to the present invention. Partial structure of the LCD device 200 is illustrated, including a plurality of gate lines GL(1)-GL(N), an M-phase bi-directional shift register 210, a clock generator 220, and a power supply 230. The clock generator 220 is configured to provide a start pulse signal VST and clock signals CK1-CKM for operating the bi-directional shift register 210. The power supply 230 is configured to provide bias voltages for operating the bi-directional shift register 210.

The bi-directional shift register 210 includes a plurality of shift register units SR(1)-SR(N) coupled in series and having output ends respectively coupled to the corresponding gate lines GL(1)-GL(N). According to the clock signals CK1-CKM and the start pulse signal VST, the bi-directional shift register 210 sequentially outputs gate driving signals GS(1)-GS(N) to the corresponding gate lines GL(1)-GL(N) using the shift register units SR(1)-SR)(N), respectively. In the LCD device 200 of the present invention, the bi-directional shift register 210 operates according to the M clock signals CK1-CKM, wherein M≧3. FIG. 3 illustrates the embodiment when M=3, wherein the clock signals CK1-CK3 periodically switch between an enable level (such as high level) and a disable level (such as low level), and only one of the clock signals CK1-CK3 is at enable level at the same time. Assuming that the shift register unit SR(n) is configured to operate according to the clock signal CK2, then the shift register units SR(n−2), SR(n−1), SR(n+1) and SR(n+2) operate according to the clock signals CK3, CK1, CK3 and CK1, respectively. Meanwhile, each current stage shift register unit further operates according to the outputs of four adjacent shift register units, two of which are triggered prior to the current stage shift register unit and the other two of which are triggered subsequent to the current stage shift register unit. For example, the shift register unit SR(n) further operates according to the gate driving signals GS(n−2), GS(n−1), GS(n+1) and GS(n+2).

FIGS. 4a-4d are diagrams illustrating an $n^{th}$ stage shift register unit SR(n) in the LCD device 200 according to the present invention (n is an integer between 1 and N). The shift register units SR(n) in the embodiments illustrated in FIGS. 4a-4d each include an output end OUT(n), a node Q(n), a pull-up circuit 10, a first pull-down circuit 30, and a second pull-down circuit 40, and respectively include input circuit 21-24. Each shift register unit SR(n) is configured to output a gate driving signal GS(n) to a gate line GL(n).

The pull-up circuit 10 includes a transistor switch T9 having a control end coupled to the node Q(n), a first end coupled to the clock generator 220 for receiving the clock signal CK2, and a second end coupled to the output end OUT(n). When the level of the node Q(n) is higher than the turn-on voltage of the transistor switch T9, the clock signal CK2 may be transmitted to the output end OUT(n) via the conducting transistor switch T9 for supplying the gate driving signal GS(n).

Figure 4A:
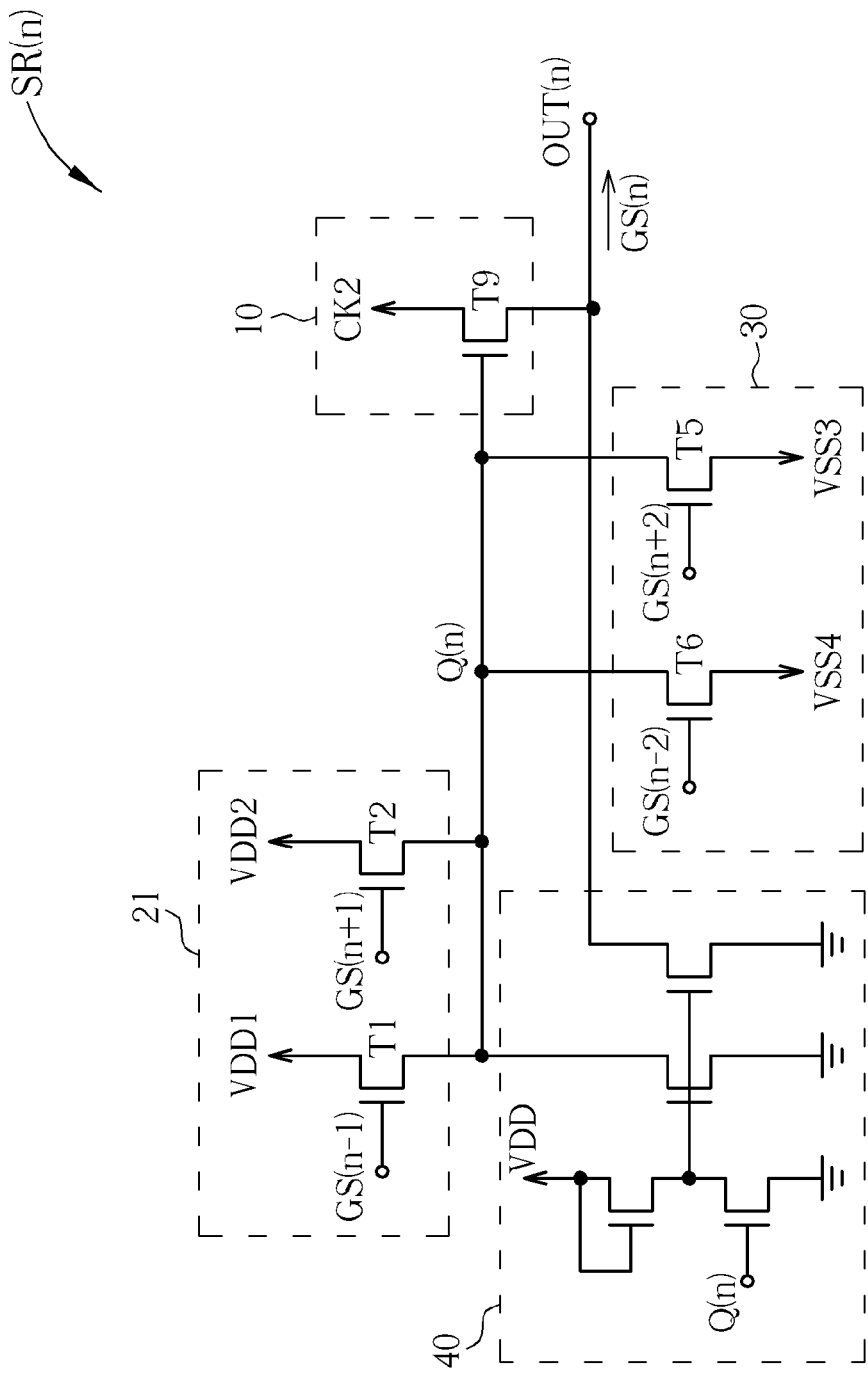
FIGS. 4a-4d are diagrams illustrating an $n^{th}$ stage shift register unit of the LCD device in FIG. 3.
Figure 4B:
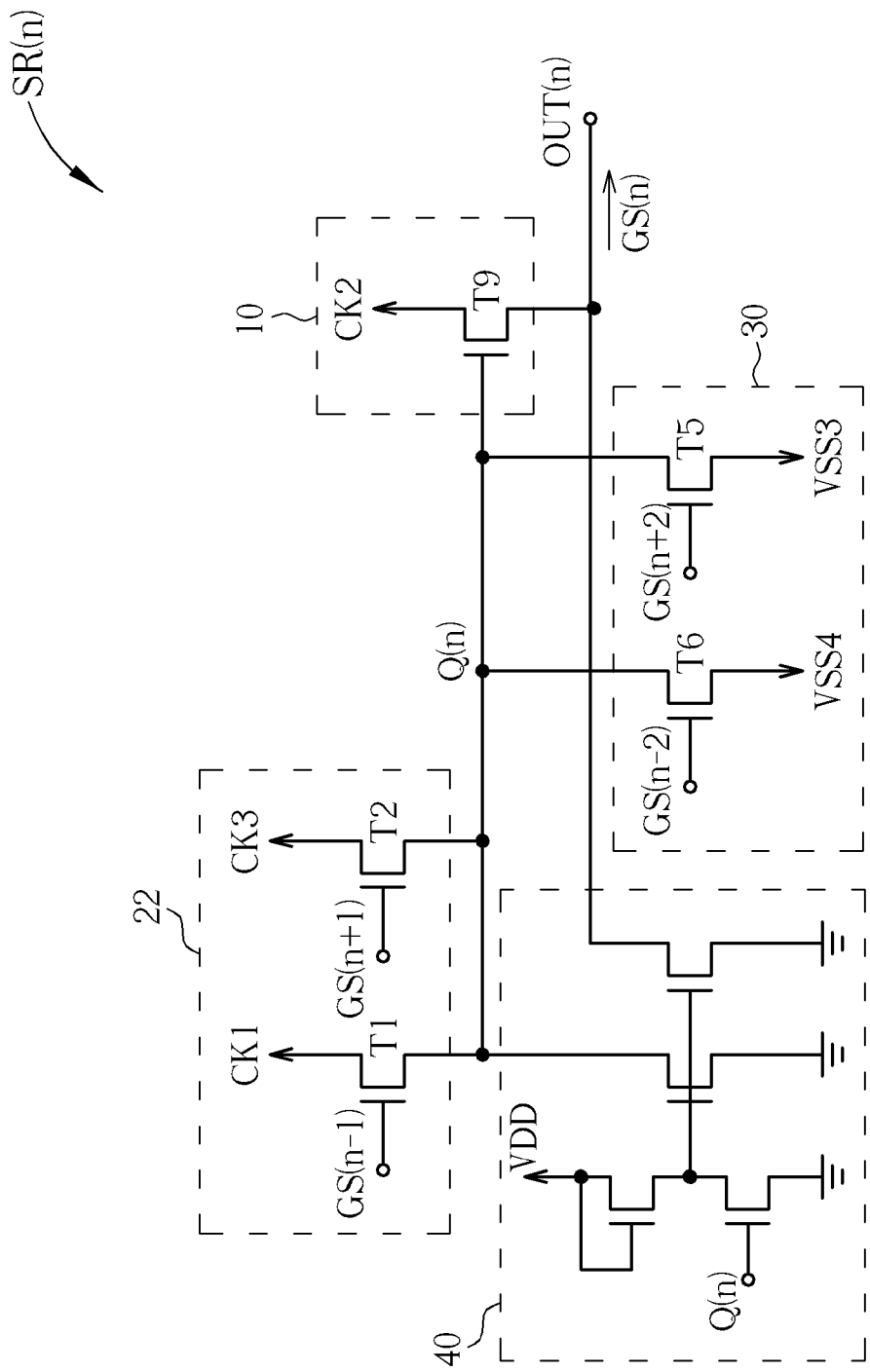
Figure 4C:
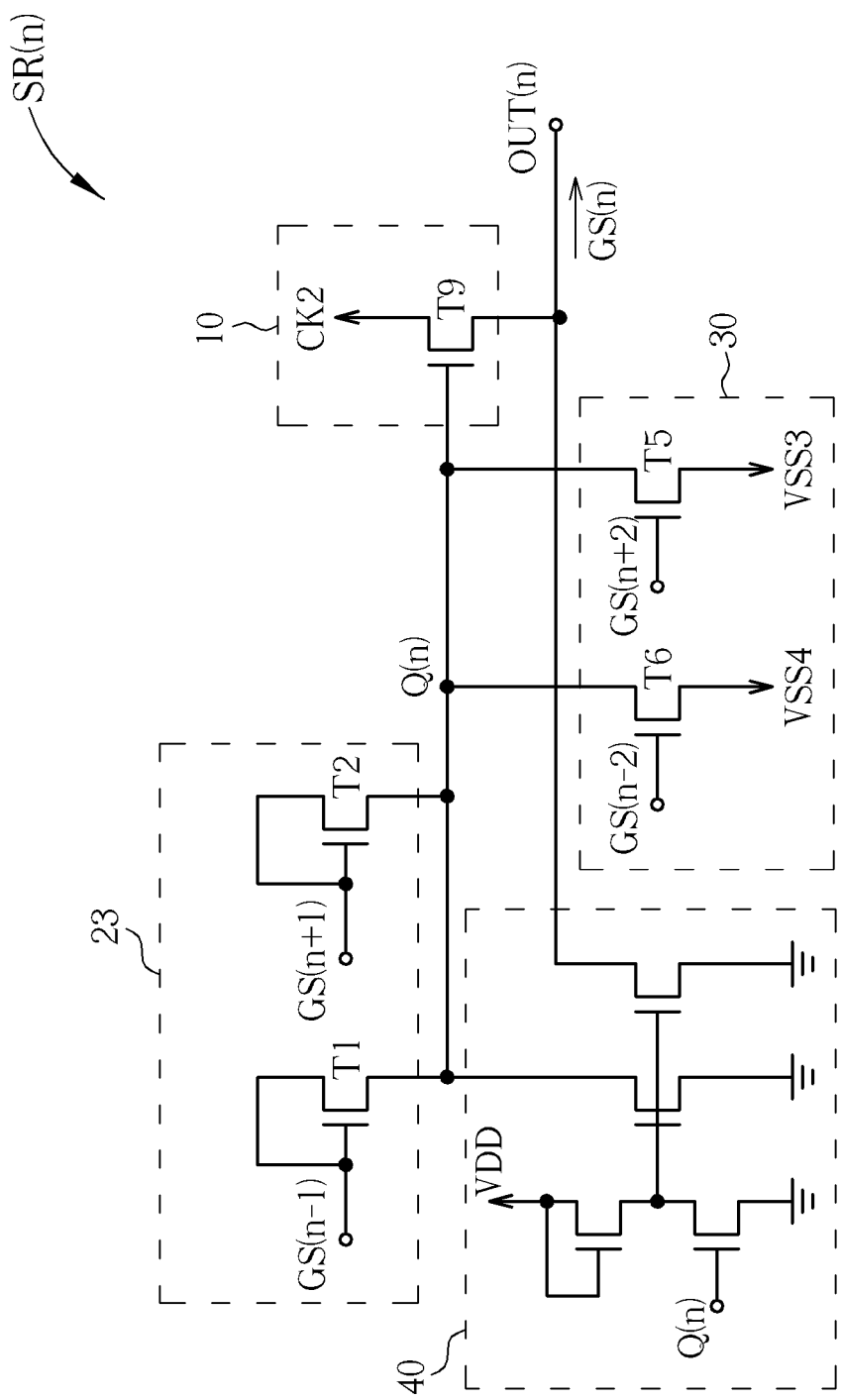

In the first to third embodiments illustrated in FIGS. 4a-4c, the input circuits 21-23 each include transistor switches T1 and T2. The transistor switch T1 includes a control end coupled to the output end of an $(n-1)^{th}$ stage shift register unit SR(n−1), a first end, and a second end coupled to the node Q(n); the transistor switch T2 includes a control end coupled to the output end of the $(n+1)^{th}$ stage shift register unit SR(n+1), a first end, and a second end coupled to the node Q(n).

In the input circuit 21 according to the first embodiment of the present invention as illustrated in FIG. 4a, the first end of the transistor switch T1 is coupled to the power supply 230 for receiving a bias voltage VDD1 and the first end of the transistor switch T2 is coupled to the power supply 230 for receiving a bias voltage VDD2, wherein the bias voltages VDD1 and VDD2 are both higher than the turn-on voltage of the transistor switch T9.

In the input circuit 22 according to the second embodiment of the present invention as illustrated in FIG. 4b, the first end of the transistor switch T1 is coupled to the clock generator 220 for receiving the clock signal CK1 and the first end of the transistor switch T2 is coupled to the clock generator 220 for receiving the clock signal CK3, wherein the enable levels of the clock signals CK1 and CK3 are both higher than the turn-on voltage of the transistor switch T9.

In the input circuit 23 according to the third embodiment of the present invention as illustrated in FIG. 4c, the first end of the transistor switch T1 is coupled to its control end for receiving the gate driving signal GS(n−1) and the first end of the transistor switch T2 is coupled to its control end for receiving the gate driving signal GS(n+1), wherein the enable levels of the clock signal CK1 (which corresponds to the gate driving signal GS(n−1)) and the clock signal CK3 (which corresponds to the gate driving signal GS(n+1)) are both higher than the turn-on voltage of the transistor switch T9.

Figure 4D:
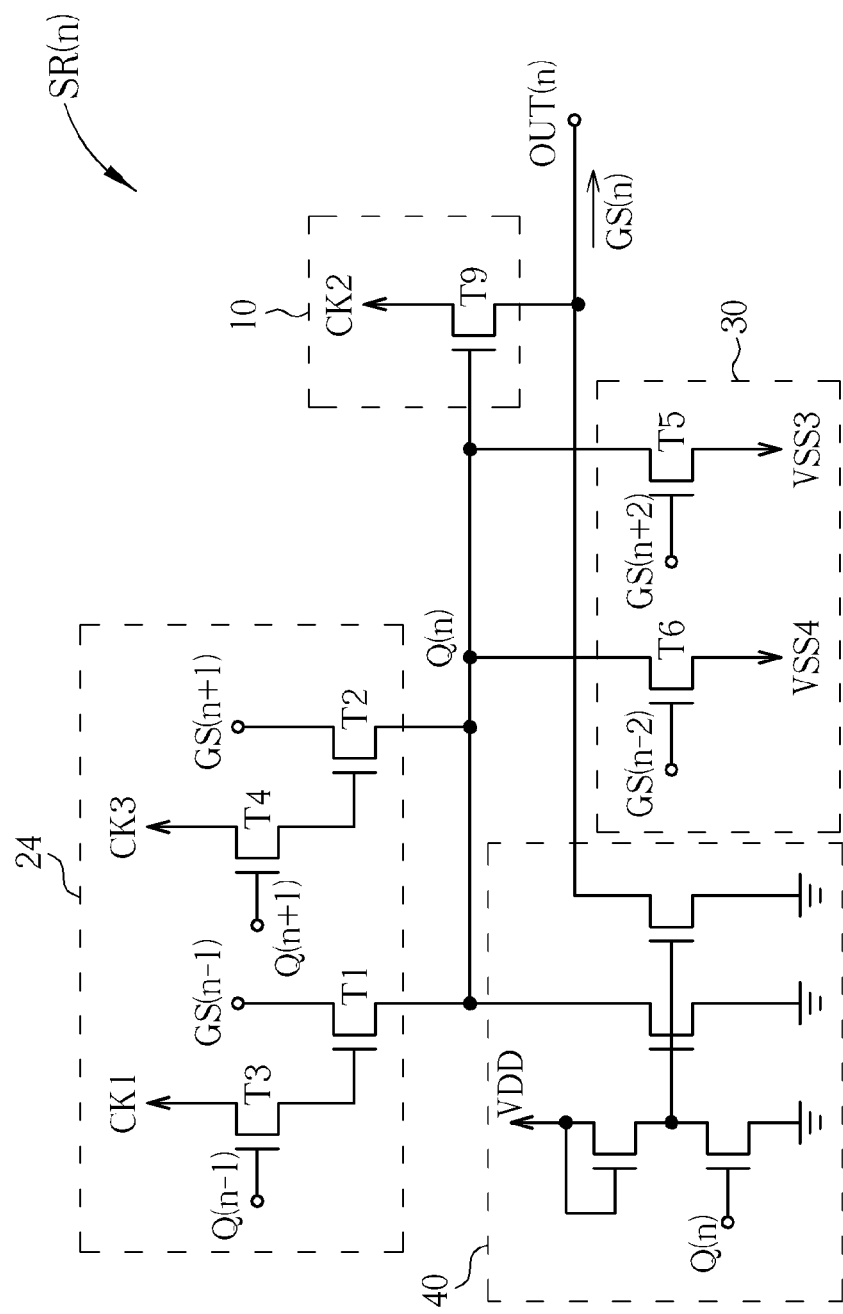

In the fourth embodiment illustrated in FIG. 4d, the input circuit 24 includes transistor switches T1-T4. The transistor switch T1 includes a first end coupled to the output end of the $(n-1)^{th}$ stage shift register unit SR(n−1), a second end coupled to the node Q(n), and a control end; the transistor switch T2 includes a first end coupled to the output end of the $(n+1)^{th}$ stage shift register unit SR(n+1), a second end coupled to the node Q(n), and a control end. The transistor switch T3 includes a control end coupled to the node Q(n−1) of the $(n-1)^{th}$ stage shift register unit SR(n−1), a first end coupled to the clock generator 220 for receiving the clock signal CK1 and a second end coupled to the control end of the transistor switch T1. The transistor switch T4 includes a control end coupled to the node Q(n+1) of the $(n+1)^{th}$ stage shift register unit SR(n+1), a first end coupled to the clock generator 220 for receiving the clock signal CK3 and a second end coupled to the control end of the transistor switch T2.

In the embodiments illustrated in FIGS. 4a-4d, the first pull-down circuit 30 includes transistor switches T5 and T6. The transistor switch T5 includes a control end coupled to the output end the an $(n+2)^{th}$ stage shift register unit SR(n+2), a first end coupled to the node Q(n), and a second end coupled to the power supply 230 for receiving a bias voltage VSS3. The transistor switch T6 includes a control end coupled to the output end the an $(n-2)^{th}$ stage shift register unit SR(n-2), a first end coupled to the node Q(n), and a second end coupled to the power supply 230 for receiving a bias voltage VSS4. The bias voltages VSS3 and VSS4 are both lower than the turn-on voltage of the transistor switch T9.

Figure 5A:
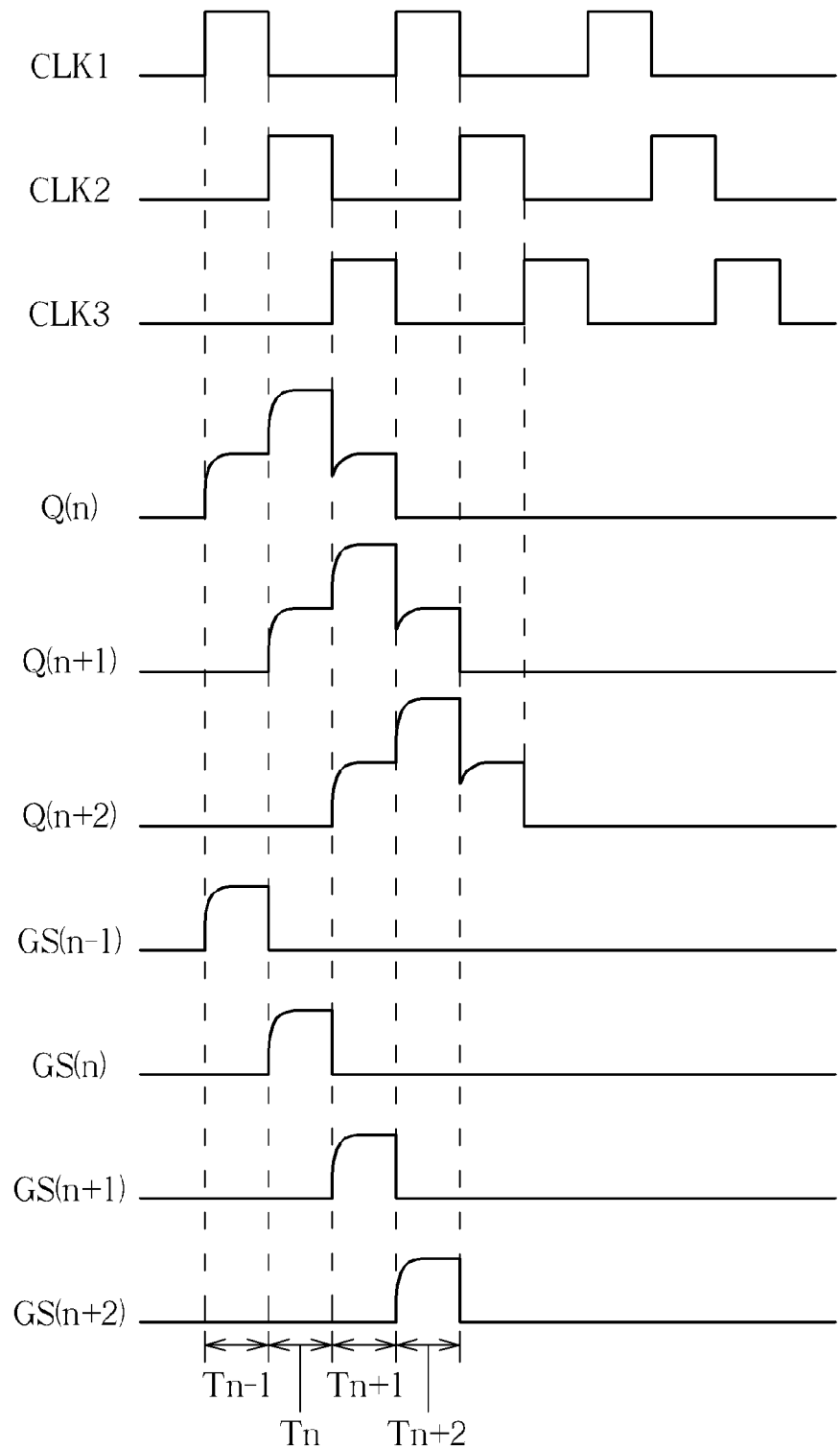
FIG. 5a is a timing diagram of the LCD device in FIG. 3 when operating in a forward-scan mode.
Figure 5B:
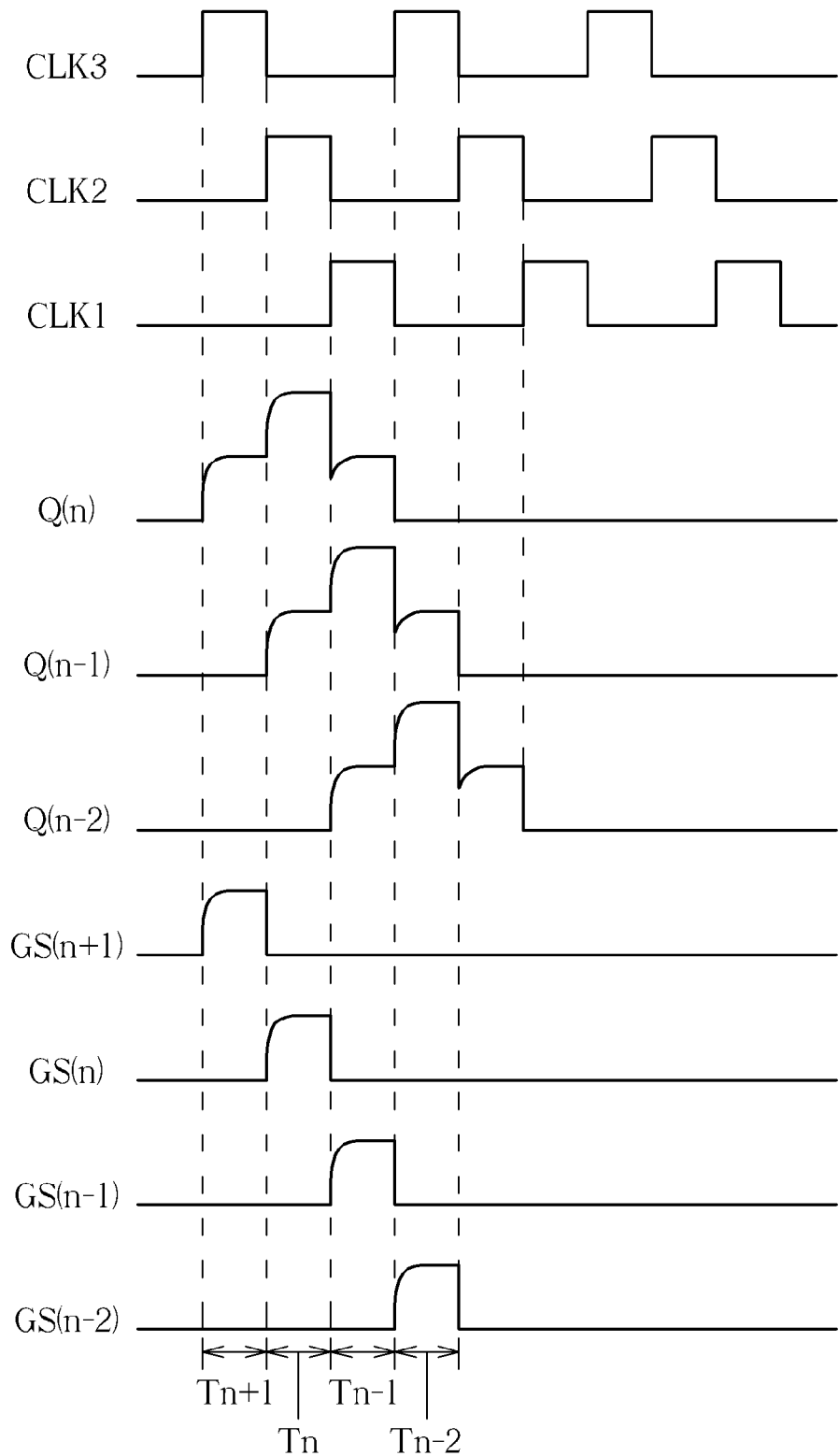
FIG. 5b is a timing diagram of the LCD device in FIG. 3 when operating in a reverse-scan mode.

FIGS. 5a and 5b illustrate the operation of the LCD device 200 according to the first through fourth embodiments of the present invention. FIG. 5a is a timing diagram of the LCD device 200 when operating in a forward-scan mode. FIG. 5b is a timing diagram of the LCD device 200 when operating in a reverse-scan mode. FIGS. 5a and 5b depict the levels of the gate driving signals GS(n-2)-GS(n+2), the clock signals CK1-CK3, and the nodes Q(n-2)-Q(n+2). $T_{n-2}$-$T_{n+2}$ represent the output periods of the gate driving signals GS(n-2)-GS(n+2), respectively. The shift register units SR(n-2)-SR(n+2) operate according to the clock signals CK3, CK1, CK2, CK3 and CK1, respectively.

When operating in the forward-scan mode as depicted in FIG. 5a, the LCD device 200 sequentially outputs gate driving signals GS(1)-GS(N) to the corresponding gate lines GL(1)-GL(N) using the shift register units SR(1)-SR(N), respectively. For illustration, the detailed operation of the LCD device 200 between the output periods $T_{n-1}$-$T_{n+2}$ is described in subsequent paragraphs.

the $(n-1)^{th}$ output period $T_{n-1}$, the clock signal CK1 and the gate driving signal GS(n-1) are at enable level. The transistor switch T1 in the input circuit 21, 22, 23 or 24 of the $n^{th}$ stage shift register unit SR(n) is turned on, thereby pulling up the level of the node Q(n) to the bias voltage VDD1, the clock signal CK1 or the gate driving signal GS(n-1) for conducting the transistor switch T9. Since the clock signal CK2 remains at disable level, the $n^{th}$ stage gate driving signal GS(n) has zero output.

During the $n^{th}$ output period $T_n$, the clock signal CK2 switches to enable level and is transmitted to the output end OUT(n) via the conducting transistor switch T9. The shift register unit SR(n) may output the $n^{th}$ gate driving signals GS(n) having enable level to the gate line GL(n).

During the $(n+1)^{th}$ output period $T_{n+1}$, the clock signal CK3 and the gate driving signal GS(n+1) are at enable level. The transistor switch T2 in the input circuit 21, 22, 23 or 24 of the $n^{th}$ stage shift register units SR(n) is turned on, thereby maintaining the level of the node Q(n) at the bias voltage VDD2, the clock signal CK3 or the $(n+1)^{th}$ stage gate driving signal GS(n+1) for conducting the transistor switch T9. Since the clock signal CK2 switches to disable level during the output period $T_{n+1}$, the $n^{th}$ stage gate driving signal GS(n) has zero output.

During the $(n+2)^{th}$ output period $T_{n+2}$, the $(n+2)^{th}$ stage gate driving signal GS(n+2) is at enable level. The transistor switch T5 in the first pull-down circuit 30 of the $n^{th}$ stage shift register unit SR(n) is turned on, thereby pulling down the level of the node Q(n) to the bias voltage VSS3 for turning off the transistor switch T9. Therefore, the $n^{th}$ stage gate driving signal GS(n) has zero output.

When operating in the reverse-scan mode as depicted in FIG. 5b, the LCD device 200 sequentially outputs gate driving signals GS(N)-GS(1) to the corresponding gate lines GL(N)-GL(1) using the shift register units SR(N)-SR(1), respectively. For illustration, the detailed operation of the LCD device 200 between the output periods $T_{n+1}$-$T_{n-2}$ is described in subsequent paragraphs.

During the $(n+1)^{th}$ output period $T_{n+1}$, the clock signal CK3 and the gate driving signal GS(n+1) are at enable level. The transistor switch T2 in the input circuit 21, 22, 23 or 24 of the $n^{th}$ stage shift register units SR(n) is turned on, thereby pulling up the level of the node Q(n) to the bias voltage VDD2, the clock signal CK3 or the gate driving signal GS(n+1) for conducting the transistor switch T9. Since the clock signal CK2 remains at disable level, the $n^{th}$ stage gate driving signal GS(n) has zero output.

During the $n^{th}$ output period $T_n$, the clock signal CK2 switches to enable level and is transmitted to the output end OUT(n) via the conducting transistor switch T9. The shift register unit SR(n) may output the $n^{th}$ gate driving signals GS(n) having enable level to the gate line GL(n).

During the $(n-1)^{th}$ output period $T_{n-1}$, the clock signal CK1 and the gate driving signal GS(n-1) are at enable level. The transistor switch T1 in the input circuit 21, 22, 23 or 24 of the $n^{th}$ stage shift register units SR(n) is turned on, thereby maintaining the level of the node Q(n) at the bias voltage VDD1, the clock signal CK1 or the $(n-1)^{th}$ stage gate driving signal GS(n-1) for conducting the transistor switch T9. Since the clock signal CK2 switches to disable level during the output period $T_{n-1}$, the $n^{th}$ stage gate driving signal GS(n) has zero output.

During the $(n-2)^{th}$ output period $T_{n-2}$, the $(n-2)^{th}$ stage gate driving signal GS(n-2) is at enable level. The transistor switch T6 in the first pull-down circuit 30 of the $n^{th}$ stage shift register unit SR(n) is turned on, thereby pulling down the level of the node Q(n) to the bias voltage VSS4 for turning off the transistor switch T9. Therefore, the $n^{th}$ stage gate driving signal GS(n) has zero output.

In the LCD device 200 according to the present invention, the input circuits 21-23 each adopt a symmetric structure formed by the transistor switches T1 and T2, the input circuit 24 adopts a symmetric structure formed by the transistor switches T1-T4, and the first pull-down circuit 30 adopts a symmetric structure formed by the transistor switches T5 and T6. Therefore, the LCD device 200 may function normally when operating in the forward-scan mode or in the reverse-scan mode. Meanwhile, the second pull-down circuit 40, configured to stabilize output voltages, may adopt various circuits well-known to those skilled in the art. FIGS. 4a-4d illustrate one embodiment of the second pull-down circuit 40 (wherein the level of the bias voltage VDD is equal to the enable level of the clock signals CK1-CK3) and does not limit the scope of the present invention. Also, the transistor switches T1-T9 may adopt metal-oxide-semiconductor (MOS) switches or other devices having similar function.

Figure 6:
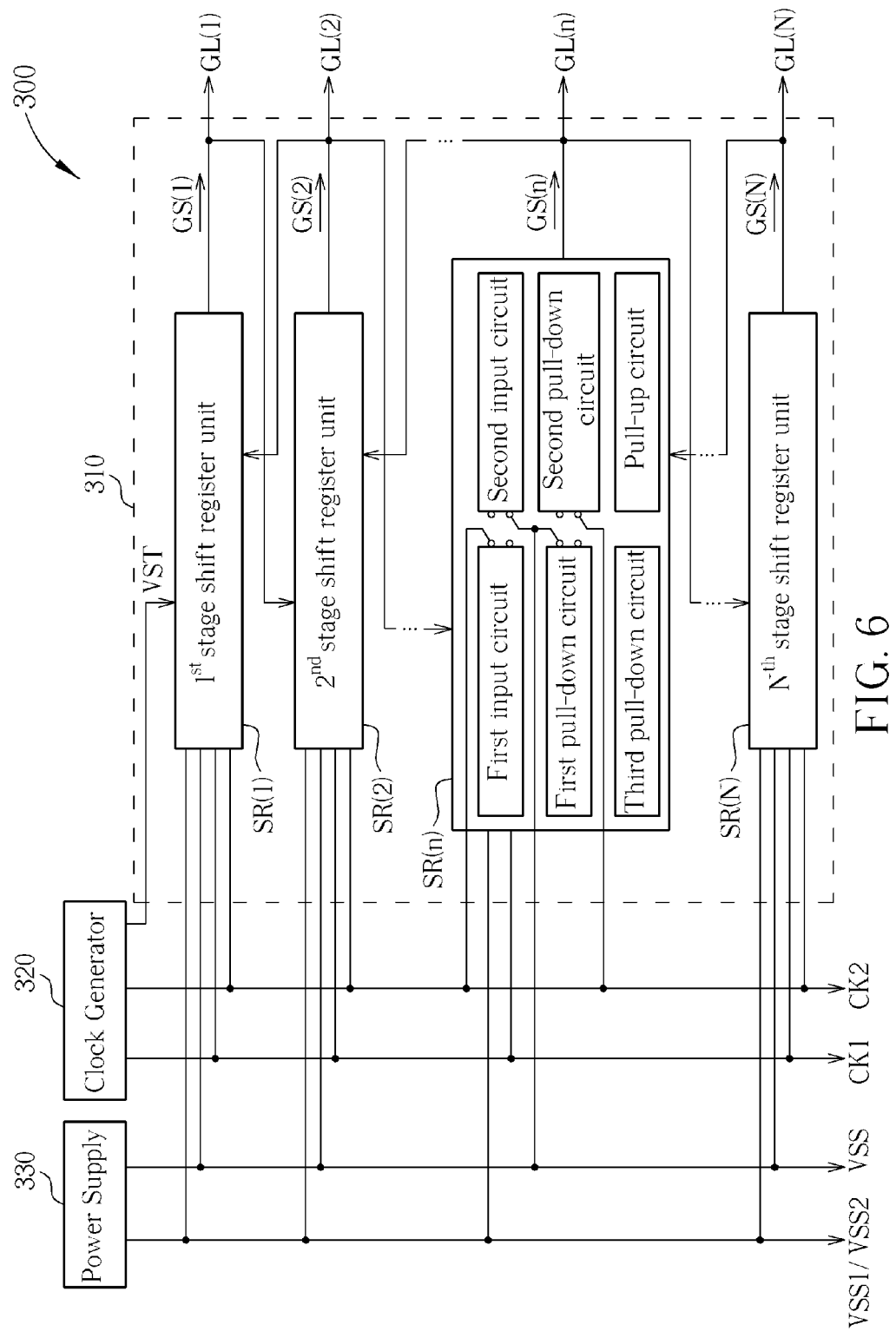
FIG. 6 is a simplified block diagram of an LCD device according to the present invention.

FIG. 6 is a simplified block diagram of an LCD device 300 according to the present invention. Partial structure of the LCD device 300 is illustrated, including a plurality of gate lines GL(1)-GL(N), an M-phase bi-directional shift register 310, a clock generator 320, and a power supply 330. The clock generator 320 is configured to provide a start pulse signal VST and clock signals CK1-CKM for operating the bi-directional shift register 310. The power supply 330 is configured to provide bias voltages for operating the bi-directional shift register 310.

The bi-directional shift register 310 includes a plurality of shift register units SR(1)-SR(N) coupled in series and having output ends respectively coupled to corresponding gate lines GL(1)-GL(N). According to the clock signals CK1-CKM and the start pulse signal VST, the bi-directional shift register 310 sequentially outputs gate driving signals GS(1)-GS(N) to corresponding gate lines GL(1)-GL(N) using the shift register units SR(1)-SR(N), respectively. In the LCD device 300 of the present invention, the bi-directional shift register 310 operates according to M clock signals CK1-CKM, wherein M≧2. FIG. 6 illustrates the embodiment when M=2, wherein the clock signals CK1 and CK2 periodically switch between an enable level and a disable level, and only one of the clock signals CK1 and CK2 is at enable level at the same time. Assuming that the shift register unit SR(n) is configured to operate according to the clock signal CK1, then the shift register units SR(n−1) and SR(n+1) both operate according to the clock signal CK2. Meanwhile, each current stage shift register unit further operates according to the outputs of two adjacent shift register units, one of which is triggered prior to the current stage shift register unit and the other one of which is triggered subsequent to the current stage shift register unit. For example, the shift register unit SR(n) further operates according to the gate driving signals GS(n−1) and GS(n+1).

Figure 7A:
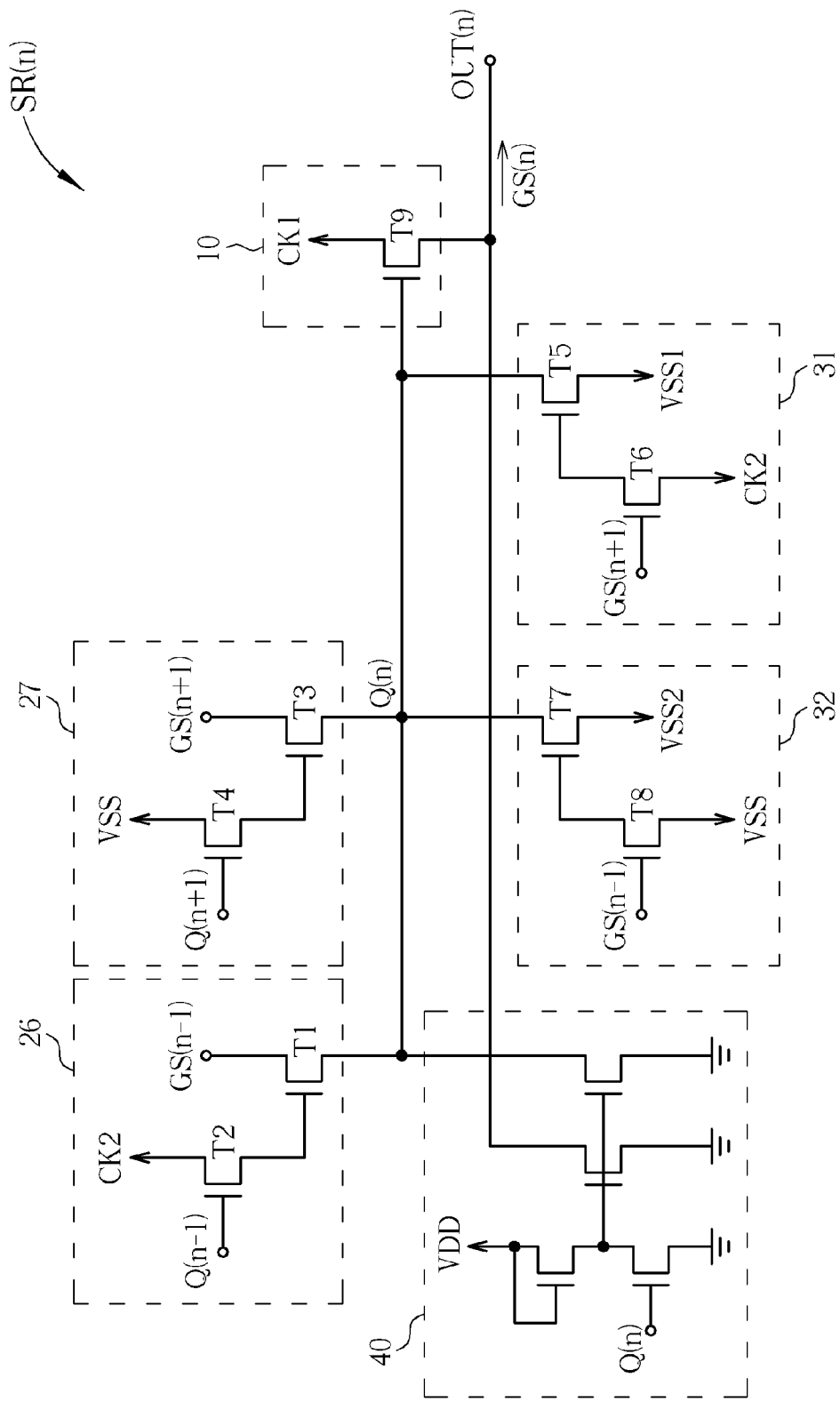
FIGS. 7a and 7b are diagrams illustrating an $n^{th}$ stage shift register unit of the LCD device in FIG. 6.

FIGS. 7a and 7d are diagrams illustrating an $n^{th}$ stage shift register unit SR(n) in the LCD device 300 according to the present invention (n is an integer between 1 and N). In the embodiments illustrated in FIGS. 7a and 7b, the shift register unit SR(n) includes an output end OUT(n), a node Q(n), a pull-up circuit 10, a first input circuit 26, a second input circuit 27, a first pull-down circuit 31, a second pull-down circuit 32, and a third pull-down circuit 40. The shift register unit SR(n) is configured to output a gate driving signal GS(n) to a gate line GL(n).

The pull-up circuit 10 includes a transistor switch T9 having a control end coupled to the node Q(n), a first end coupled to the clock generator 320 for receiving the clock signal CK1, and a second end coupled to the output end OUT(n). When the level of the node Q(n) is higher than the turn-on voltage of the transistor switch T9, the clock signal CK1 may be transmitted to the output end OUT(n) via the conducting transistor switch T9 for supplying the gate driving signal GS(n).

The first input circuit 26 includes transistor switches T1 and T2. The transistor switch T1 includes a control end, a first end coupled to the output end of the $(n-1)^{th}$ stage shift register unit SR(n−1) and a second end coupled to the node Q(n); the transistor switch T2 includes a control end coupled to the node Q(n−1) of the $(n-1)^{th}$ stage shift register unit SR(n−1), a first end coupled to a first control signal and a second end coupled to the control end of the transistor switch T1.

The second input circuit 27 includes transistor switches T3 and T4. The transistor switch T3 includes a control end, a first end coupled to the output end of the $(n+1)^{th}$ stage shift register unit SR(n+1) and a second end coupled to the node Q(n); the transistor switch T4 includes a control end coupled to the node Q(n+1) of the $(n+1)^{th}$ stage shift register unit SR(n+1), a first end coupled to a second control signal and a second end coupled to the control end of the transistor switch T3.

The first pull-down circuit 31 includes transistor switches T5 and T6. The transistor switch T5 includes a control end, a first end coupled to the node Q(n), and a second end coupled to the power supply 330 for receiving a bias voltage VSS1, wherein the bias voltage VSS1 is lower than the turn-on voltage of the transistor switch T9. The transistor switch T6 includes a control end coupled to the output end of the $(n+1)^{th}$ stage shift register unit SR(n+1), a first end coupled to the control end of the transistor switch T5, and a second end coupled to the first control signal. The second pull-down circuit 32 includes transistor switches T7 and T8. The transistor switch T7 includes a control end, a first end coupled to the node Q(n), and a second end coupled to the power supply 330 for receiving a bias voltage VSS2, wherein the bias voltage VSS2 is lower than the turn-on voltage of the transistor switch T9. The transistor switch T8 includes a control end coupled to the output end of the $(n-1)^{th}$ stage shift register unit SR(n−1), a first end coupled to the control end of the transistor switch T7, and a second end coupled to the second control signal.

Figure 7B:
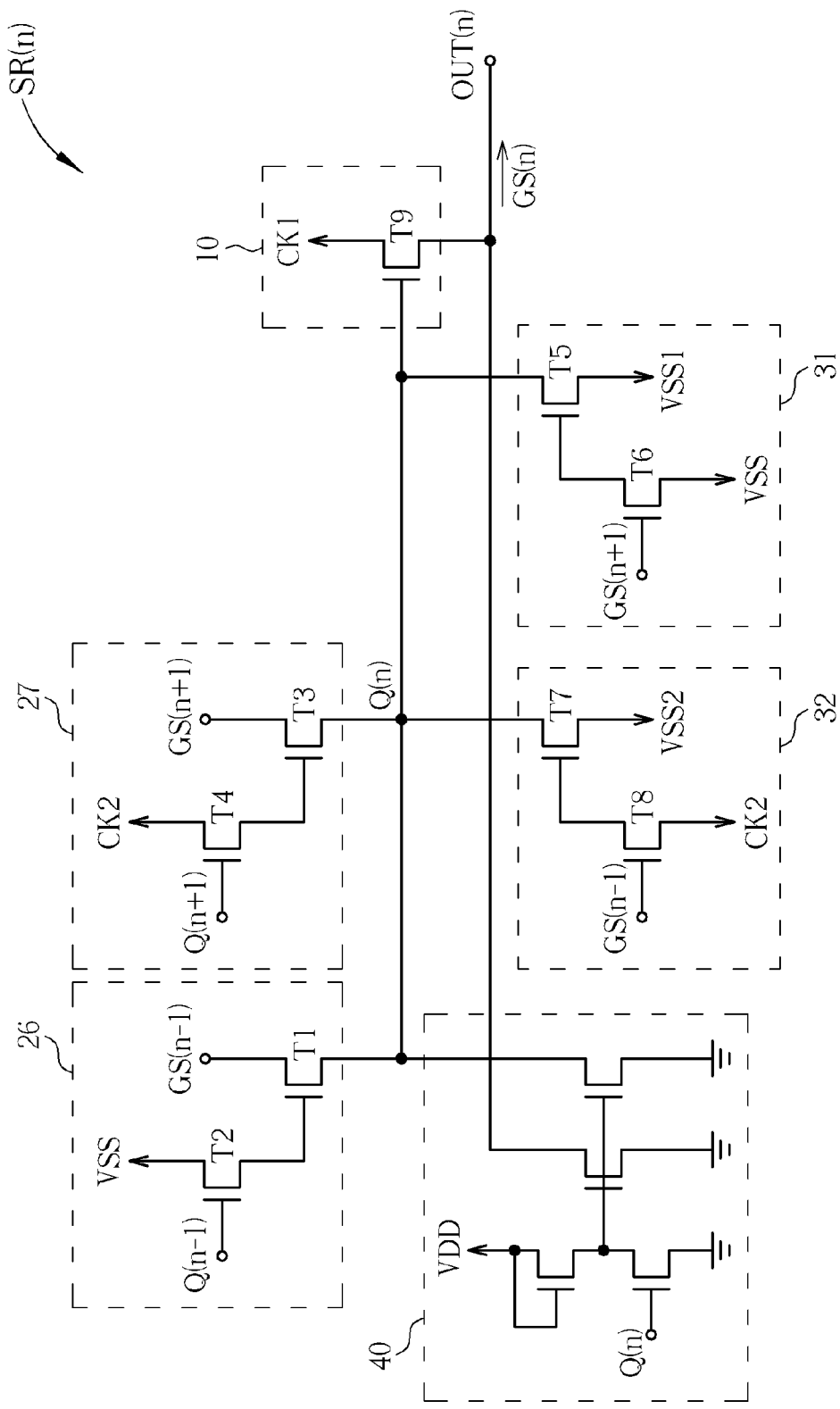

FIG. 7a illustrates an embodiment when the LCD device 300 operates in the forward-scan mode, wherein the first control signal may be the clock signal CK2 provided by the clock generator 320 and the second control signal may be the bias voltage VSS provided by the power supply 330. FIG. 7b illustrates an embodiment when the LCD device 300 operates in the reverse-scan mode, wherein the first control signal may be the bias voltage VSS provided by the power supply 330 and the second control signal may be the clock signal CK2 provided by the clock generator 320. The bias voltage VSS is lower than the turn-on voltages of the transistor switches T1, T3, T5 and T7.

Figure 8A:
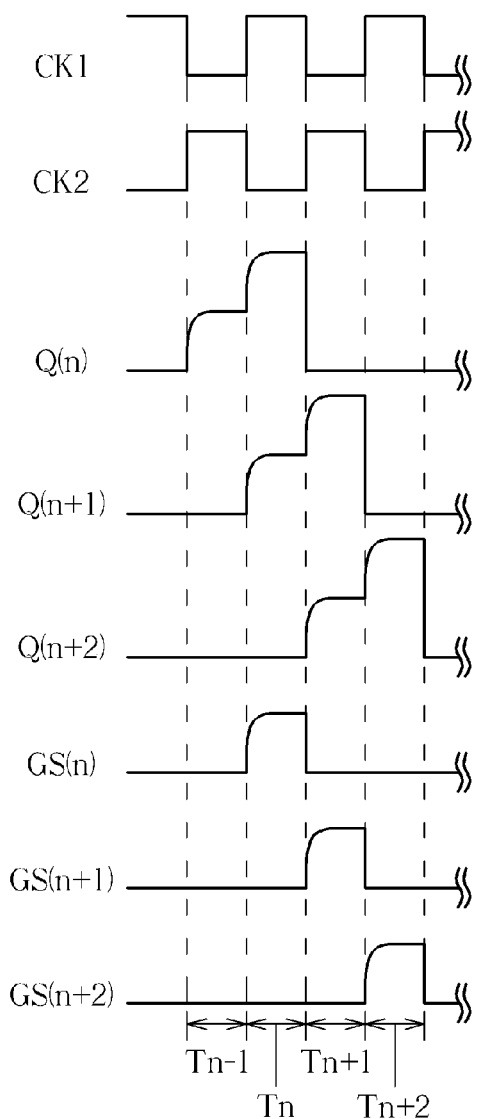
FIG. 8a is a timing diagram of the LCD device in FIG. 6 when operating in a forward-scan mode.

When operating in the forward-scan mode as depicted in FIG. 8a, the LCD device 300 sequentially outputs gate driving signals GS(1)-GS(N) to the corresponding gate lines GL(1)-GL(N) using the shift register units SR(1)-SR(N), respectively. For illustration, the detailed operation of the LCD device 300 between the output periods $T_{n-1}$-$T_{n+1}$ is described in subsequent paragraphs.

During the $(n-1)^{th}$ output period $T_{n-1}$, the clock signal CK2, the node Q(n) and the gate driving signal GS(n−1) are at enable level. The transistor switches T1 and T2 in the first input circuit 26 of the $n^{th}$ stage shift register unit SR(n) are turned on, thereby pulling up the level of the node Q(n) to the gate driving signal GS(n−1) for conducting the transistor switch T9. Since the clock signal CK1 remains at disable level, the $n^{th}$ stage gate driving signal GS(n) has zero output.

During the $n^{th}$ output period $T_n$, the clock signal CK1 switches to enable level and is transmitted to the output end OUT(n) via the conducting transistor switch T9. The shift register unit SR(n) may output the $n^{th}$ gate driving signals GS(n) having enable level to the gate line GL(n).

During the $(n+1)^{th}$ output period $T_{n+1}$, the clock signal CK2 and the gate driving signal GS(n+1) are at enable level. The transistor switches T5 and T6 in the first pull-down circuit 31 of the $n^{th}$ stage shift register units SR(n) are turned on, thereby pulling down the level of the node Q(n) to the bias voltage VSS1 for turning off the transistor switch T9. Therefore, the $n^{th}$ stage gate driving signal GS(n) has zero output. Since the bias voltage VSS is lower than the turn-on voltages of the transistor switches T3 and T7, the second input circuit 27 and the second pull-down circuit 31 are turned off when the LCD device 300 operates in the forward-scan mode.

Figure 8B:
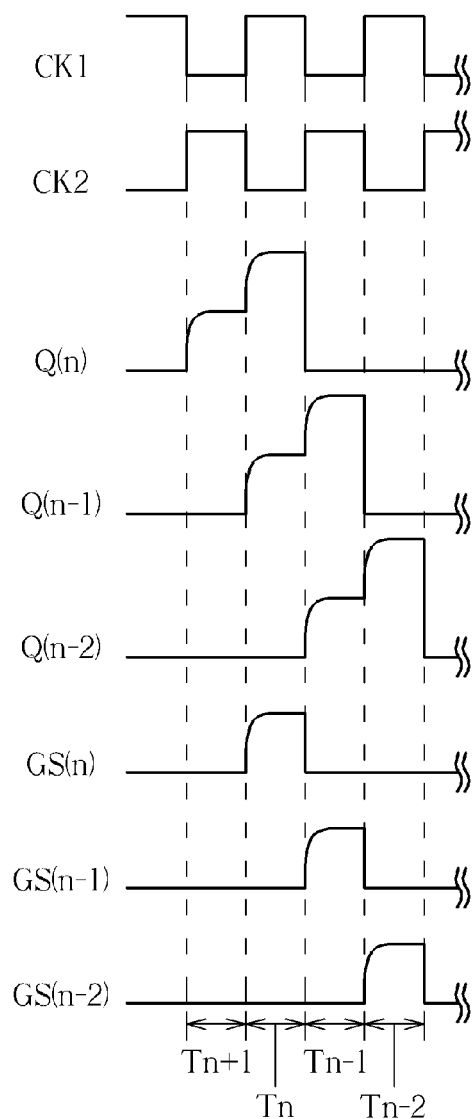
FIG. 8b is a timing diagram of the LCD device in FIG. 6 when operating in a reverse-scan mode.

When operating in the reverse-scan mode as depicted in FIG. 8b, the LCD device 300 sequentially outputs gate driving signals GS(N)-GS(1) to the corresponding gate lines GL(N)-GL(1) using the shift register units SR(N)-SR(1), respectively. For illustration, the detailed operation of the LCD device 300 between the output periods $T_{n+1}$-$T_{n-1}$ is described in subsequent paragraphs.

During the $(n+1)^{th}$ output period $T_{n+1}$, the clock signal CK2, the node Q(n+1) and the gate driving signal GS(n+1) are at enable level. The transistor switches T3 and T4 in the second input circuit 27 of the $n^{th}$ stage shift register unit SR(n) are turned on, thereby pulling up the level of the node Q(n) to the gate driving signal GS(n+1) for conducting the transistor switch T9. Since the clock signal CK1 remains at disable level, the $n^{th}$ stage gate driving signal GS(n) has zero output.

During the $n^{th}$ output period $T_n$, the clock signal CK1 switches to enable level and is transmitted to the output end OUT(n) via the conducting transistor switch T9. The shift register unit SR(n) may output the $n^{th}$ gate driving signals GS(n) having enable level to the gate line GL(n).

During the $(n-1)^{th}$ output period $T_{n-1}$, the clock signal CK2 and the gate driving signal GS(n−1) are at enable level. The transistor switches T7 and T8 in the second pull-down circuit 32 of the $n^{th}$ stage shift register units SR(n) are turned on, thereby pulling down the level of the node Q(n) to the bias voltage VSS2 for turning off the transistor switch T9. Therefore, the $n^{th}$ stage gate driving signal GS(n) has zero output. Since the bias voltage VSS is lower than the turn-on voltages of the transistor switches T1 and T5, the first input circuit 26 and the first pull-down circuit 31 are turned off when the LCD device 300 operates in the reverse-scan mode.

In the LCD device 300 according to the present invention, the first input circuit 26 and the second input circuit 27 each adopt a symmetric structure, and the first pull-down circuit 31 and the second pull-down circuit 32 adopts a symmetric structure. Therefore, by switching between the first and second control signals, the LCD device 300 may function normally when operating in the forward-scan mode or in the reverse-scan mode. Meanwhile, the third pull-down circuit 40, configured to stabilize output voltages, may adopt various circuits well-known to those skilled in the art. FIGS. 7a and 7d illustrate one embodiment of the third pull-down circuit 40 (wherein the level of the bias voltage VDD is equal to the enable level of the clock signals CK1-CK2) and does not limit the scope of the present invention. Also, the transistor switches T1-T9 may adopt MOS switches or other devices having similar function.

The bi-directional shift register according to the present invention adopts input circuits and pull-down circuits having a symmetric structure. More flexible driving methods may be provide since the LCD device of the present invention may function normally when operating in the forward-scan mode or in the reverse-scan mode.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bi-directional shift register including a plurality of shift register units coupled in series, wherein:
   an $(n-1)^{th}$ stage shift register unit among the plurality of shift register units is configured to provide an $(n-1)^{th}$ stage output voltage according to a first clock signal and an $(n-1)^{th}$ stage input voltage;
   an $n^{th}$ stage shift register unit among the plurality of shift register units is configured to provide an $n^{th}$ stage output voltage according to a second clock signal and an $n^{th}$ stage input voltage;
   an $(n+1)^{th}$ stage shift register unit among the plurality of shift register units is configured to provide an $(n+1)^{th}$ stage output voltage according to a third clock signal and an $(n+1)^{th}$ stage input voltage; and
   the $n^{th}$ stage shift register unit includes:
      an output end for outputting the $n^{th}$ stage output voltage;
      an $n^{th}$ node;
      a pull-up circuit configured to provide the $n^{th}$ stage output voltage according to the second clock signal and a voltage level of the $n^{th}$ node;
      an input circuit configured to receive the $(n-1)^{th}$ stage output voltage and the $(n+1)^{th}$ stage output voltage, supply the $(n-1)^{th}$ stage output voltage as the $n^{th}$ stage input voltage when the bi-directional shift register scans in a first direction, supply the (n+1)th stage output voltage as the $n^{th}$ input voltage when the bi-directional shift register scans in a second direction opposite to the first direction, and conduct the pull-up circuit according to the $(n-1)^{th}$ stage output voltage and the $(n+1)^{th}$ stage output voltage, the input circuit comprising:
         a first switch including:
            a first end coupled to a first bias voltage higher than a voltage for conducting the pull-up circuit;
            a second end coupled to the $n^{th}$ node; and
            a control end for receiving the $(n-1)^{th}$ stage output voltage; and
         a second switch including:
            a first end coupled to a second bias voltage higher than the voltage for conducting the pull-up circuit;
            a second end coupled to the $n^{th}$ node; and
            a control end for receiving the $(n+1)^{th}$ stage output voltage;
      a first pull-down circuit configured to turn off the pull-up circuit according to a first voltage received from an $x^{th}$ stage shift register unit among the plurality of shift register units when the bi-directional shift register scans in the first direction, and configured to turn off the pull-up circuit according to a second voltage received from a $y^{th}$ stage shift register unit among the plurality of shift register units when the bi-directional shift register scans in the second direction, wherein n is a positive integer larger than 1, x is an integer larger than n, and y is a positive integer smaller than n; the first pull-down circuit comprising:
         a third switch including:
            a first end coupled to the $n^{th}$ node;
            a second end coupled to a third bias voltage lower than a voltage for conducting the pull-up circuit; and
            a control end for receiving the first voltage; and
         a fourth switch including:
            a first end coupled to the nth node;
            a second end coupled to a fourth bias voltage lower than the voltage for conducting the pull-up circuit; and
            a control end for receiving the second voltage; and
      a second pull-down circuit comprising:
         a fourth switch including:
            a first end coupled to the output end of the $n^{th}$ stage shift register unit;
            a second end coupled to a fifth bias voltage lower than a voltage for conducting the pull-up circuit; and
            a control end; and
         a fifth switch including:
            a first end coupled to the $n^{th}$ node;
            a second end coupled to the fifth bias voltage; and
            a control end coupled to the control end of the fourth switch;
         a sixth switch including:
            a first end coupled to the control end of the fourth switch;
            a second end coupled to the fifth bias voltage; and
            a control end coupled to the $n^{th}$ node; and
         a seventh switch including:
            a first end coupled to a sixth bias voltage higher than a voltage for conducting the seventh switch;
            a second end coupled to the control end of the fourth switch; and
            a control end coupled to the first end of the seventh switch.

2. The bi-directional shift register of claim 1, wherein the plurality of shift register units further comprise:
- an $(n-2)^{th}$ stage shift register unit configured to supply an $(n-2)^{th}$ stage output voltage as the second voltage according to a fourth clock signal; and
- an $(n+2)^{th}$ stage shift register unit configured to supply an $(n+2)^{th}$ stage output voltage as the first voltage according to a fifth clock signal;
- wherein the first to fifth clock signals periodically switch between an enable level and a disable level, and only one clock signal among the first to third clock signals is at the enable level at the same time.

3. The bi-directional shift register of claim 2, wherein the first and fifth clock signals are identical, and the third and fourth clock signals are identical.

4. The bi-directional shift register of claim 1, wherein the pull-up circuit comprises:
- an eighth switch including:
  - a first end for receiving the second clock signal;
  - a second end coupled to the output end; and
  - a control end coupled to the $n^{th}$ node.

5. A bi-directional shift register comprising:
- an $(n-1)^{th}$ stage shift register unit configured to provide an $(n-1)^{th}$ stage output voltage according to a first clock signal and an $(n-1)^{th}$ stage input voltage;
- an $n^{th}$ stage shift register unit coupled in series to the $(n-1)^{th}$ stage shift register unit and configured to provide an $n^{th}$ stage output voltage according to a second clock signal and an $n^{th}$ stage input voltage; the $n^{th}$ stage shift register unit including:
  - an output end for outputting the $n^{th}$ stage output voltage;
  - an $n^{th}$ node;
  - a pull-up circuit configured to provide the $n^{th}$ stage output voltage according to the second clock signal and a voltage level of the $n^{th}$ node;
  - an input circuit configured to receive the $(n-1)$th stage output voltage and an $(n+1)^{th}$ stage output voltage, supply the $(n-1)^{th}$ stage output voltage as the $n^{th}$ stage input voltage when the bi-directional shift register scans in a first direction, supply the $(n+1)^{th}$ stage output voltage as the $n^{th}$ input voltage when the bi-directional shift register scans in a second direction opposite to the first direction, and conduct the pull-up circuit according to the $(n-1)^{th}$ stage output voltage and the $(n+1)^{th}$ stage output voltage, the input circuit comprising:
    - a first switch including:
      - a first end coupled to a first bias voltage higher than a voltage for conducting the pull-up circuit;
      - a second end coupled to the $n^{th}$ node; and
      - a control end for receiving the $(n-1)^{th}$ stage output voltage; and
    - a second switch including:
      - a first end coupled to a second bias voltage higher than the voltage for conducting the pull-up circuit;
      - a second end coupled to the $n^{th}$ node; and
      - a control end for receiving the $(n+1)^{th}$ stage output voltage;
  - a first pull-down circuit configured to turn off the pull-up circuit according to a first voltage received from an $x^{th}$ stage shift register unit among the plurality of shift register units when the bi-directional shift register scans in the first direction, and configured to turn off the pull-up circuit according to a second voltage received from a $y^{th}$ stage shift register unit among the plurality of shift register units when the bi-directional shift register scans in the second direction, wherein n is a positive integer larger than 1, x is an integer larger than n, and y is a positive integer smaller than n; the first pull-down circuit comprising:
    - a third switch including:
      - a first end coupled to the $n^{th}$ node;
      - a second end coupled to a third bias voltage lower than a voltage for conducting the pull-up circuit; and
      - a control end for receiving the first voltage; and
    - a fourth switch including:
      - a first end coupled to the $n^{th}$ node;
      - a second end coupled to a fourth bias voltage lower than the voltage for conducting the pull-up circuit; and
      - a control end for receiving the second voltage; and
  - a second pull-down circuit comprising:
    - a fourth switch including:
      - a first end coupled to the output end of the $n^{th}$ stage shift register unit;
      - a second end coupled to a fifth bias voltage lower than a voltage for conducting the pull-up circuit; and
      - a control end; and
    - a fifth switch including:
      - a first end coupled to the $n^{th}$ node;
      - a second end coupled to the fifth bias voltage; and
      - a control end coupled to the control end of the fourth switch;
    - a sixth switch including:
      - a first end coupled to the control end of the fourth switch;
      - a second end coupled to the fifth bias voltage; and
      - a control end coupled to the $n^{th}$ node; and
    - a seventh switch including:
      - a first end coupled to a sixth bias voltage higher than a voltage for conducting the seventh switch;
      - a second end coupled to the control end of the fourth switch; and
      - a control end coupled to the first end of the seventh switch; and
- an $(n+1)^{th}$ stage shift register unit configured to provide an $(n+1)^{th}$ stage output voltage according to a third clock signal and an $(n+1)^{th}$ stage input voltage.

6. The bi-directional shift register of claim 5, further comprising:
- an $(n-2)^{th}$ stage shift register unit configured to supply an $(n-2)^{th}$ stage output voltage as the second voltage according to a fourth clock signal; and
- an $(n+2)^{th}$ stage shift register unit configured to supply an $(n+2)^{th}$ stage output voltage as the first voltage according to a fifth clock signal;
- wherein the first to fifth clock signals periodically switch between an enable level and a disable level, and only one clock signal among the first to third clock signals is at the enable level at the same time.

7. The bi-directional shift register of claim 6, wherein the first and fifth clock signals are identical, and the third and fourth clock signals are identical.

8. The bi-directional shift register of claim 5, wherein the pull-up circuit comprises:
- an eighth switch including:
  - a first end for receiving the second clock signal;
  - a second end coupled to the output end; and
  - a control end coupled to the $n^{th}$ node.

* * * * *